United States Patent
Slezak et al.

(10) Patent No.: US 8,594,262 B2
(45) Date of Patent: Nov. 26, 2013

(54) APPARATUS AND METHOD THEREOF FOR CLOCK AND DATA RECOVERY OF N-PAM ENCODED SIGNALS USING A CONVENTIONAL 2-PAM CDR CIRCUIT

(75) Inventors: Yaron Slezak, Ra'anana (IL); Genady Veytsman, Netanya (IL)

(73) Assignee: TranSwitch Corporation, Shelton, CT (US)

( * ) Notice: Subject to any disclaimer, the term of this patent is extended or adjusted under 35 U.S.C. 154(b) by 178 days.

(21) Appl. No.: 13/157,526

(22) Filed: Jun. 10, 2011

(65) Prior Publication Data

US 2011/0311008 A1    Dec. 22, 2011

Related U.S. Application Data

(60) Provisional application No. 61/355,758, filed on Jun. 17, 2010.

(51) Int. Cl.
    *H03K 7/02*      (2006.01)

(52) U.S. Cl.
    USPC .......................................... 375/353; 375/360

(58) Field of Classification Search
    USPC ......... 375/257, 353, 354, 368, 371–376, 287, 375/360
    See application file for complete search history.

(56) References Cited

U.S. PATENT DOCUMENTS

| | | | |
|---|---|---|---|
| 6,584,163 B1 * | 6/2003 | Myers et al. ................... | 375/360 |
| 7,099,400 B2 | 8/2006 | Yang et al. | |
| 7,308,048 B2 | 12/2007 | Wei | |
| 2003/0016056 A1 * | 1/2003 | Matsuzaki ..................... | 326/86 |
| 2004/0109509 A1 | 6/2004 | Stonecypher et al. | |
| 2004/0141567 A1 * | 7/2004 | Yang et al. ..................... | 375/287 |
| 2005/0089126 A1 * | 4/2005 | Zerbe et al. .................... | 375/353 |
| 2006/0051405 A1 * | 3/2006 | MacLachlan et al. ......... | 424/450 |
| 2006/0158225 A1 | 7/2006 | Stojanovic et al. | |
| 2006/0203939 A1 * | 9/2006 | Chou et al. ..................... | 375/319 |
| 2006/0233291 A1 | 10/2006 | Garlepp et al. | |
| 2006/0280272 A1 | 12/2006 | Stojanovic | |
| 2009/0161747 A1 | 6/2009 | Aziz et al. | |
| 2010/0061467 A1 * | 3/2010 | Ogiso ............................ | 375/257 |
| 2010/0220828 A1 | 9/2010 | Fuller et al. | |
| 2010/0259332 A1 * | 10/2010 | Tan ................................ | 331/17 |
| 2011/0274154 A1 * | 11/2011 | Aziz et al. ..................... | 375/233 |
| 2012/0288027 A1 * | 11/2012 | Stojanovic et al. ........... | 375/295 |

OTHER PUBLICATIONS

Zerbe, Jared L et al., "Equalization and Clock Recovery for a 2.5-10-Gb/s 2-PAM/4-PAM Backplane Transceiver Cell"; IEEE Journal of Solid-State Circuits; Dec. 2003; pp. 2121-2130; vol. 38, No. 12.

* cited by examiner

*Primary Examiner* — Emmanuel Bayard
(74) *Attorney, Agent, or Firm* — Myers Wolin, LLC

(57) ABSTRACT

An interface circuit for enabling clock and data recovery (CDR) of N-level pulse amplitude modulation (N-PAM) modulated data streams using a 2-PAM CDR circuit. The circuit comprises a number of N−1 comparators for comparing an input data stream to N−1 configurable thresholds, the input data stream is N-PAM modulated and the N−1 configurable thresholds are N−1 different voltage levels; a number of N−1 of edge detectors respectively connected to the N−1 comparators for detecting transitions from one logic value to another logic value, N is a discrete number greater than two; and a determination unit for determining if the detected transitions is any one of a major transition and a minor transition and asserting a transition signal if only a major transition or a minor transition has occurred, the transition signal is fed into a 2-PAM CDR circuit and utilized for recovering a clock signal of the input data stream.

23 Claims, 4 Drawing Sheets

APPARATUS AND METHOD THEREOF FOR CLOCK AND DATA RECOVERY OF N-PAM ENCODED SIGNALS USING A CONVENTIONAL 2-PAM CDR CIRCUIT

CROSS REFERENCE TO RELATED APPLICATION

This application claims the benefit of U.S. Provisional Application No. 61/355,758 filed on Jun. 17, 2010, the contents of which are hereby incorporated by reference.

TECHNICAL FIELD

This invention generally relates to a clock and data recovery apparatus and method thereof.

BACKGROUND OF THE INVENTION

High-speed interface links connecting two devices over a physical cable are typically serial communication links. Examples for such links include, but are not limited to, a high-definition multimedia interface (HDMI), a digital video interface (DVI), DisplayPort (DP), Universal Serial Bus 3 (USB3), and others.

During the process of data transmission, a transmitter continuously transmits signals to a receiver. The receiver uses a clock and data recovery (CDR) circuit to generate a clock corresponding to the incoming data stream, thereby correctly retiming the incoming data. Clock and data recovery (CDR) circuits may be based on a phase-locked loop (PLL) or an over-sampler. A PLL based CDR circuit generates a clock from an approximate frequency reference and uses the generated clock to phase-align to the transitions in the data stream with the PLL. The generated clock is a recovered clock transmitted by the transmitter.

Typically, the physical cable exhibits the characteristics of a low-pass filter. Therefore, the amplitude of the recovered data, received at the receiver, is attenuated and the phase is distorted. Also, the physical cable typically consists of wires which are not perfectly shielded. Thus, noise is present in the recovered data due to cross coupling between signals from different wires.

Transmitted serial signals can be modulated using, for example, N-pulse amplitude modulation (N-PAM), where N discrete voltage levels are used to encode input bits. The two common PAM techniques utilized to modulate high-speed serial signals are 2-PAM (also known as non-return-to-zero "NRZ") or 4-PAM. In a 2-PAM two levels are used to encode a single bit. In a 4-PAM, two bits are mapped to one of four possible differential voltage levels, for example, −3 volts, −1 volt, 1 volt, and 3 volts. Demodulation is performed by detecting the amplitude level of the carrier at every symbol period. The 4-PAM allows transmitting signals at double the rate of the 2-PAM signal, but the loss of 4-PAM modulated signals is higher than that of 2-PAM modulated signals. Experiments have shown that when the loss of the physical medium is more than 10 dB, the 4-PAM has been used in preference to 2-PAM.

When transmitting 4-PAM modulated signals, the receiver should implement a CDR circuit for recovering such signals. However, 4-PAM CDR circuits are more complex than 2-PAM CDR circuits. In addition, 2-PAM CDR circuits cannot be utilized to recover 4-PAM modulated signals. Some solutions discussed in the related art provide a 4-PAM CDR circuit that can handle 2-PAM and 4-PAM modulated signals. For example, the 2-PAM/4-PAM is discussed in IEEE publication titled "*Equalization and Clock Recovery for a 2.5-10-Gb/s 2-PAM/4-PAM Backplane Transceiver Cell*" to Zerbe, et al. However, Zerbe's proposed circuit is a 4-PAM CDR circuit that has been adapted to also handle 2-PAM signals.

One of the difficulties when implementing 4-PAM CDR circuits is to detect the correct point to sample the incoming data stream, as each 2-bit may include four transitions. Thus, detecting a correct sampling point may be a challenge. Existing solutions try to overcome this problem by generating control signals to control the CDR circuit, to change the location of the data to be sampled by the CDR circuits. The control signals are generated by comparing the current bit with the previous bit. However, such solutions require redesign of CDR circuits to support the new control. Thus, a 2-PAM CDR circuit cannot be utilized to recover 4-PAM or N-PAN (N>2) signals.

It would be, therefore, advantageous to provide a solution for clock and data recovery of N-PAM modulated signals using a 2-PAM CDR circuit.

SUMMARY OF THE INVENTION

Certain embodiments disclosed herein include an interface circuit for enabling clock and data recovery (CDR) of N-level pulse amplitude modulation (N-PAM) modulated data streams using a 2-PAM CDR circuit. The circuit comprises a number of N−1 comparators for comparing an input data stream to N−1 configurable thresholds, wherein the input data stream is N-PAM modulated and the N−1 configurable thresholds are N−1 different voltage levels; a number of N−1 of edge detectors respectively connected to the N−1 comparators for detecting transitions from one logic value to another logic value, wherein N is a discrete number greater than two; and a determination unit for determining if the detected transitions is any one of a major transition and a minor transition and asserting a transition signal if only a major transition or a minor transition has occurred, wherein the transition signal is fed into a 2-PAM CDR circuit and utilized for recovering a clock signal of the input data stream.

Certain embodiments disclosed herein also include a method for enabling clock and data recovery (CDR) of N-level pulse amplitude modulation (N-PAM) modulated data streams using a 2-PAM CDR circuit. The method comprises comparing an input data stream to N−1 configurable thresholds, wherein the input data stream is N-PAM modulated and the N−1 configurable thresholds are N−1 different voltage levels; detecting transitions from one logic value to another logic value based on comparisons of the input data stream to the N−1 configurable thresholds, wherein N is a discrete number greater than two; and determining if the detected transitions include any one of a major transition and a minor transition; and asserting a transition signal if only a major transition or a minor transition has occurred, wherein the transition signal is fed into a 2-PAM CDR circuit and utilized for recovering a clock signal of the input data stream.

Certain embodiments disclosed herein also include a receiver connected to a serial multimedia interface for processing high-speed multimedia signals transmitted by a transmitter over the serial multimedia interface. The receiver comprises an adaptive equalizer for receiving an input data stream over the serial multimedia interface and generating an equalized input data stream, wherein the input data stream is a N-level pulse amplitude modulation (N-PAM) modulated data stream; an interface circuit connected to the adaptive equalizer for generating a transition signal indicating of only major and minor transitions in the equalized input data stream and generating bit-data streams from the equalized input data stream, wherein N is a discrete number greater than two and the number of bit-data stream is based on the number of voltage levels in the input modulated data stream; a 2-PAM clock and data recover (CDR) circuit for locking on a signal used in transmission of the input data stream based, in part, on the transition signal; and a data sampler for sampling the bit-data stream and generating serial bit streams, each of the serial bit streams includes k bits.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION OF THE INVENTION

Figure 1:
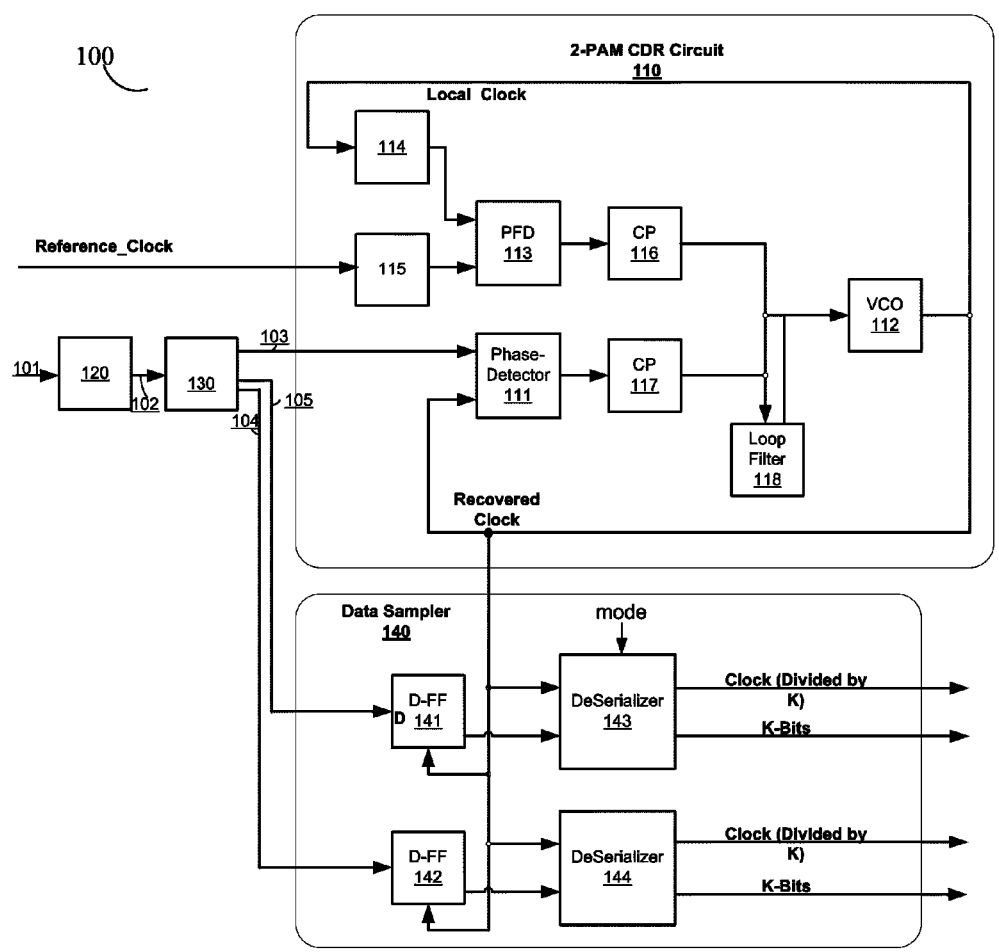
FIG. 1 is a block diagram of a receiver in accordance with an embodiment of the invention.

The embodiments disclosed by the invention are only examples of the many possible advantageous uses and implementations of the innovative teachings presented herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the drawings, like numerals refer to like parts through several views.

FIG. 1 shows an exemplary and non-limiting block diagram of a receiver 100 in accordance with an embodiment of the invention. The receiver 100 includes 2-PAM CDR circuit 110, an adaptive equalizer 120, and an interface 130 connected between the circuit 110 and adaptive equalizer 120. In one embodiment, the receiver 100 also includes a data sampler 140. The receiver 100 is typically connected at one end of a serial multimedia interface and is capable of processing high-speed multimedia signals transmitted by a transmitter over the interface. The interface may be any type of serial communication links including, but not limited to, a high-definition multimedia interface (HDMI), a digital video interface (DVI), a DisplayPort (DP), a Universal Serial Bus 3 (USB3), and others.

An input data stream 101 is equalized by the adaptive equalizer 120 to output an equalized data stream 102. The equalizer 120 compensates for the media (cable) losses depending upon the frequency. The input data stream 101 is a high-speed serial data modulated using either a 2-PAM or 4-PAM modulation technique. The 2-PAM CDR circuit 110 is a conventional PLL-based 2-PAM CDR circuit that can recover clock and data signals that are 2-PAM modulated. According to certain embodiments disclosed herein, the 2-PAM CDR circuit can also recover input data stream 101 modulated using N-PAM technique, where N is a discrete number greater than 2. According to a preferred embodiment of the invention, the 2-PAM CDR circuit 110 recovers 4-PAM modulated input data stream 101.

The data sampler 140 recovers the data signal using a recovered clock signal generated by the CDR circuit 110. When operating in a 2-PAM mode, only 1 bit at a time is received from the interface 130, while in the 4-PAM mode 2 bits are input at a time. Thus, in the 4-PAM mode the data sampler 140 generates 2*k parallel bits, from an input serial bit stream.

In accordance with certain embodiments of the invention, the interface 130 generates transition signals 103 based on the equalized data stream 102. The CDR circuit 110 phase aligns to the transitions in the input data stream 101 according to the transition signal 103. Therefore, as the input data stream 101 may be 2-PAM or 4-PAM modulated, the interface 130 enables the clock and data recovery of 4-PAM modulated data using the 2-PAM CDR circuit 110. It should be noted that no modification is made to the 2-PAM CDR circuit 110 to support this feature. Thus, the interface 130 generates a data stream that can be correctly recovered by a conventional 2-PAM CDR circuit. This is opposed to techniques for generating control signals (e.g., Early-Late signals) for contorting 4-PAM CDR circuits.

The interface 130 also outputs, to the data sampler 140, bit-data streams 104 and 105. The interface 130 outputs the bit-data streams 104, 105 and transition signal 103 at the same time. In should be noted that when operating in a 2-PAM mode, only one of bit-data streams 104, 105 is active, thus only 1-bit data is output by the interface 130.

The 2-PAM CDR circuit 110 also includes a phase detector 111, a voltage control oscillator (VCO) 112 to generate a local clock signal, a phase-frequency detector (PFD) 113 that receives the local clock signal divided by a frequency divider 114 and also a reference clock (Ref_clock) divided by a frequency divider 115. The CDR circuit 110 also includes a charge pump (CP) 116 connected to the output of the PFD 113 and a charge pump (CP) 117 connected to the output of the phase detector 111, and a loop filter 118. The 2-PAM CDR circuit 110 is designed to detect the clock signal for recovering the data streams. With this aim, the CDR circuit 110 includes two feedback loops to tune the VCO 112 to generate the correct recovered clock.

The phase detector 111 compares the local clock signal phase as output by the VCO 112 to the phase of the incoming transition signal 103, and generates a first phase error signal (PE1). As mentioned above, the transition signal is generated by detecting only major and minor transitions in the input the data signals, thus the phase detector 111 phase aligns to the transitions in the input data stream 101 based on the transition signal 103. The first phase error signal (PE1) generated by phase detector 111 is fed to the charge pump 117 which smoothes the PE1 signal.

In the second feedback loop, the PFD 113 compares the phase difference between local clock signal, as output by the divider 114, and a reference clock signal, as output by the divider 115, and outputs a second phase difference signal (PE2) accordingly. The outputs of the charge pumps 116 and 117 are provided to the loop filter 118 that generates a control signal to tune the VCO 112. The control signal is a voltage signal and its magnitude is related to the magnitude of the phase differences between the local clock signal, the reference clock signal, and the transition signal 102. When the phase error is small enough, the VCO is locked and its local clock signal is the recovered clock signal that can be used to sample the incoming bit stream (on outputs 104 and 105) by the data sampler 140.

The data sampler 140 includes flip-flops 141 and 142 connected to de-serializers 143 and 144, respectively. The respective flip-flops 141 and 142 sample the bit-data streams 104 and 105 generated by the interface circuit 130 using the recovered clock signal to produce a recovered bit-data. Each of the de-serializers 143 and 144 converts a bit of a sampled bit-data stream to 'k' parallel bits (k is an integer number greater than 1, and in an exemplary embodiment k=10). In the 4-PAM mode, both de-serializers 143 and 144 are active, thus the data sampler 140 outputs 2*k parallel bits (serial bit streams) of the recovered signal. According to an embodiment of the invention, in the 2-PAM mode, only the de-serializer 144 is enabled, thus only k parallel bits are output. The control of the operation of the de-serializer 143 is using the "mode" signal. Each of the de-serializers 143 and 144 also receives the recovered clock signal, provided by the CDR circuit 110, and generates a clock signal divided by k, as there are k bits in the output stream.

Figure 2:
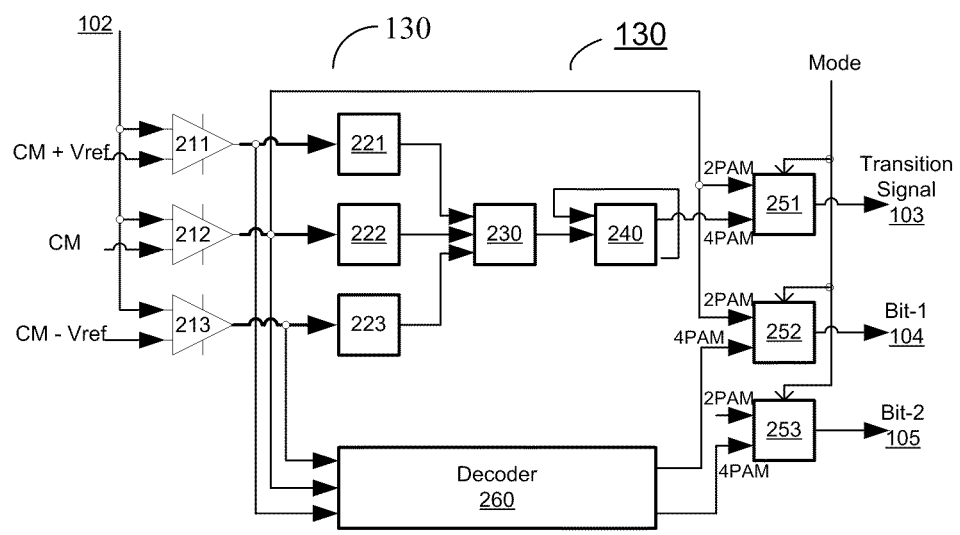
FIG. 2 is a block diagram of an interface circuit utilized to adapt 4-PAM modulated signals to be recovered by a 2-PAM CDR circuit in accordance with an embodiment of the invention.

FIG. 2 shows an exemplary and non-limiting block diagram of the interface 130 implemented in accordance with an embodiment of the invention. The equalized input data 102 may be either 2-PAM or 4-PAM modulated signals. When operating in a 2-PAM mode, a comparator 212 compares the equalized data stream 102 to a reference signal set to a common-mode voltage level to determine if an input bit is below or above the common-mode voltage level. The comparator 212 is a zero crossing comparator. An exemplary embodiment the value of the common-mode voltage level is 0.8V.

The output of the comparator 212 is fed into the 2-PAM input of a multiplex (MUX) 251. In addition, the output of the comparator 212 is connected to the input 2-PAM of a multiplex 252 to output the 1-bit data 104 to the data sampler 140. In the 2-PAM mode, the 2-PAM input of the multiplexer 251 and 252 is selected. The decoder 260, in its 2-PAM mode of operation, maps the output of the comparator 212 to either '0' or '1' logic value. For example, the decoder 260 outputs a zero-logic value '0' when the comparator 212 indicates that an input signal is below a common-mode, and otherwise, outputs a high-logic value '1'. The outputs of signals 103 and 104 are simultaneously sent to the CDR circuit 110 and the data sampler 140 respectively.

Figure 3:
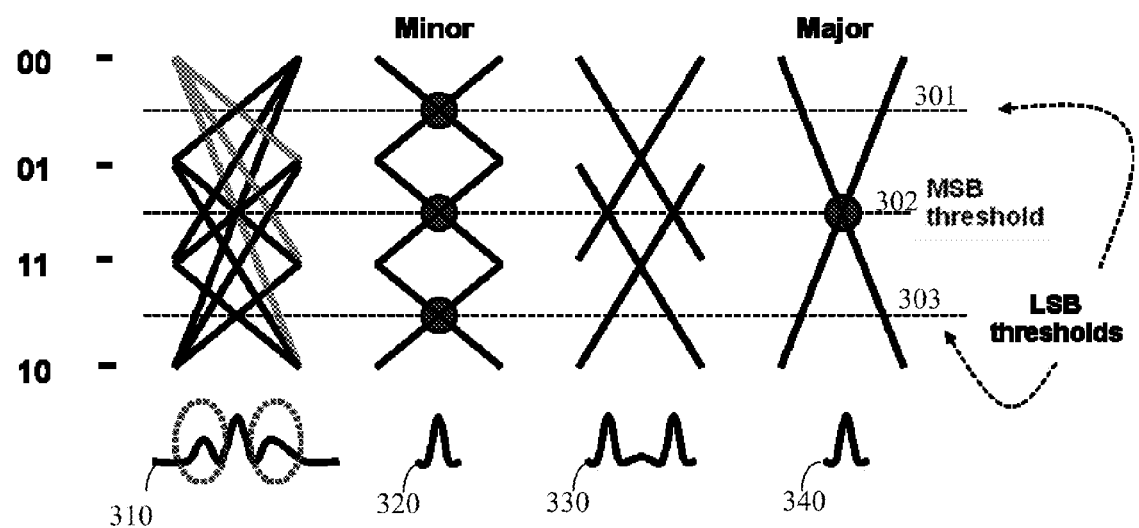
FIG. 3 is a diagram illustrating transition types in 4-PAM modulated signals.

In the 4-PAM mode of operation of the interface 130, minor and major transitions in the equalized data stream 102 are detected. Depending on the data coding, the interface 130 can detect only major/minor transitions in the equalized data stream 102. As illustrated in FIG. 3, a complete transition space (signal 310) consists of minor transitions (signal 320) which are transitions of one threshold level, simultaneous transitions of two threshold levels (signals 330), and major transitions (signal 340) which are transitions of three threshold levels. To allow correct recovery of the data the 2-PAM CDR circuit 110 should handle only major and minor transitions and ignore simultaneous LSB/MSB transitions, as the latter type of transitions induce phase errors in the CDR process. Further, by handling only major or minor transitions, the jitter of a recovered clock signal is significantly reduced, thus enabling correct recovery of data.

In accordance with an embodiment of the invention, when the input data 101 is 4-PAM modulated, the interface 130 detects either major or minor transitions and generates the transition signal 103 only based on these transitions. The equalized data stream 102 is compared to the upper and lower LSB thresholds (labeled as 301 and 303 in FIG. 3) using comparators 211 and 213, and to the MSB threshold (labeled as 302 in FIG. 3) using a comparator 212. The LSB and MSB thresholds are preconfigured based on the transmitter's levels. Alternatively or collectively, the various thresholds may be calibrated during Power-Up of the receiver 100 to compensate for various mismatches. In one embodiment of the invention, the comparator 211 is set to the common-mode (CM) voltage level plus a reference voltage level (Vref) to represent the upper LSB threshold value (301 in FIG. 3); the comparator 212 is set to the common-mode voltage level to represent the MSB threshold value (302 in FIG. 3); and the comparator 213 is set to the common-mode voltage level minus the Vref to represent the lower LSB threshold value (303 in FIG. 3). In an exemplary embodiment, the Vref equals to 133 mV and the common-mode voltage level is 0.8V.

Table 1 provides an example for the outputs of the comparators 211, 212, and 213 with respect to the voltage level of 4-PAM modulated signal.

TABLE 1

| 4-PAM levels | Comparator 211 | Comparator 212 | Comparator 213 |
|---|---|---|---|
| +3 V | 1 | 1 | 1 |
| +1 V | 0 | 1 | 1 |
| −1 V | 0 | 0 | 1 |
| −3 V | 0 | 0 | 0 |

It should be noted that '1' represents crossing of a respective configurable threshold. Based on the outputs, the type of the transition can be detected. For example, transition of +3 to +1 happens only when comparator 211 changes.

Referring back to FIG. 2, the outputs of the comparators 211, 212 and 213 are respectively fed into edge detectors 221, 222, and 223 to determine whether a transition from one logic level to another has occurred. Edge detectors 221, 222, and 223 detect crossing of LSB threshold 301 (FIG. 3), MSB threshold 302 (FIG. 3), and LSB threshold 303 (FIG. 3) respectively. For example, the edge detector 221 detects transitions from '00' to '01', the edge detector 222 detects transitions from '00' to '10', and the edge detector 223 detects transitions from '00' to '10'. An edge detector asserts a signal when a transition is detected.

The determination unit 230 determines if a transition detected by one or more edge detectors 221, 222, and 223 is either a major or a minor transition. If such transitions are detected, the determination unit 230 asserts a determination signal to the flip-flop 240, which in response, changes its output state. Specifically, the determination unit 230 asserts the determination signal, when either one or all of the edge detectors 221, 222, and 223 detect(s) a transition in the logic value. Simultaneous LSB/MSB transitions are ignored by the determination unit 230 and such transitions are detected when two of the detectors 221, 222, and 223 assert their output signals (i.e., two of the detectors detect changes in the logic value).

In the 4-PAM mode, the inputs "4PAM" of the multiplexers 251, 252, and 253 are selected, by a mode control signal. Such a signal is typically set by a controller (not shown) of the receiver when the control is not asserted. In addition, in this mode of operation, the decoder 260 maps the comparison results of the comparators 211, 212, and 213 into two bits. Table 2 shows an example for the mapping performed by the decoder 260.

TABLE 2

| 4-PAM levels | Comparator 211 | Comparator 212 | Comparator 213 | Decoder's 260 output |
|---|---|---|---|---|
| +3 V | 1 | 1 | 1 | 00 |
| +1 V | 0 | 1 | 1 | 01 |
| −1 V | 0 | 0 | 1 | 10 |
| −3 V | 0 | 0 | 0 | 11 |

The decoder 260 also delays its outputs 104 and 105, until the transition signal 103 is ready. Thus, the outputs of the interface 130 include bit-data streams (104 and 105) fed to the data sampler 140 and a transition signal 103 input to the CDR circuit 110.

Figure 4:
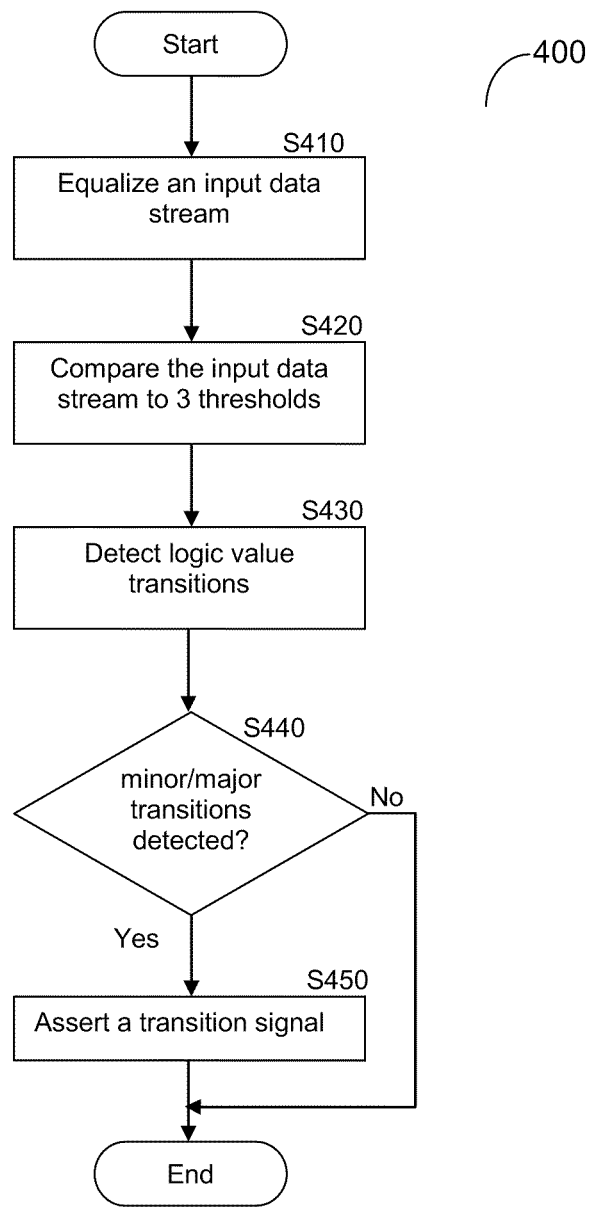
FIG. 4 is a flowchart illustrating a method disclosed according to an embodiment of the invention.

FIG. 4 shows an exemplary and non-limiting flowchart 400 illustrating a method for enabling clock and data recovery of 4-PAM modulated signals using a 2-PAM CDR circuit. At S410, an input bit stream modulated as a 4-PAM signal is equalized by an adaptive equalizer to compensate for the media (cable) losses. At S420, the equalized data stream is compared to three configurable thresholds set to different voltage levels. According an embodiment of the invention, the thresholds are preset based on the transmitter's voltage levels of transmitted signals, various offsets of the interface circuit 130 and/or a cable's DC attenuation. In another embodiment, configurable thresholds may be calibrated during power-up of the receiver. At S430, based on the comparison results, transitions from one logic value to another are detected. As depicted in FIG. 3, many different transitions from one value to another value of the signal may occur. At S440, it is determined if the detected transitions are either major or minor transitions, and if so, at S450 generating a transition signal indicating an occurrence of either a major or a minor transition; otherwise, execution ends. A major transition is a logic value change in MSB and the LSB remains at '0' (i.e., 00 to 10, or 10 to 00) and a minor transition is a logic value change in a LSB or a change in the MSB and the LSB remains '1' (e.g., 00 to 01, 01 to 00, 10 to 11, 11 to 10, 11 to 01, or 01 to 11), where the MSB and LSB are two bits in the input data stream. Transitions that are not minor or major transitions are ignored.

As mentioned above, the 2-PAM CDR circuit locks on the input data and recovered clock using the transition signal. In addition, the method simultaneously outputs the transition signals with the data to be recovered.

The present invention has been described with reference to a specific embodiment where a 2-PAM CDR circuit is utilized to recover 4-PAM modulated signals. It should be appreciated that a person with ordinary skill in art can easily adapt the embodiments disclosed herein to support clock and data recovery of N-PAM modulated signals by a conventional 2-PAM CDR circuit.

The principles of the invention may be implemented as any combination of hardware, firmware, and software. Moreover, the software is preferably implemented as an application program tangibly embodied on a program storage unit or computer readable medium. One of ordinary skill in the art would recognize that a "machine readable medium" or computer readable medium is a non-transitory medium capable of storing data and can be in a form of a digital circuit, an analogy circuit, a magnetic media or combination thereof. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit.

The foregoing detailed description has set forth a few of the many forms that the invention can take. It is intended that the foregoing detailed description be understood as an illustration of selected forms that the invention can take and not as a limitation to the definition of the invention.

What is claimed is:

1. An interface circuit for enabling clock and data recovery (CDR) of N-level pulse amplitude modulation (N-PAM) modulated data streams using a 2-PAM CDR circuit, comprising:

a number of N−1 comparators for comparing an input data stream to N−1 configurable thresholds, wherein the input data stream is N-PAM modulated and the N−1 configurable thresholds are N−1 different voltage levels;

a number of N−1 of edge detectors respectively connected to the N−1 comparators for detecting transitions from one logic value to another logic value, wherein N is a discrete number greater than two;

a determination unit for determining if a detected transition is any one of a major transition and a minor transition, wherein a major transition is a logic value change in a most significant bit (MSB) and a least significant bit (LSB) remains at a low-logic value, and a minor transition is a logic value change in a LSB or a logic value change in the MSB and the LSB remains at a high-logic value, wherein the MSB and LSB are two bits out of 2 bits in the input data stream; and asserting a transition signal if only a major transition or a minor transition has occurred, wherein the transition signal is fed into a 2-PAM CDR circuit and utilized for recovering a clock signal of the input data stream by phase aligning to the transitions in the input data stream.

2. The interface circuit of claim 1, further comprising: a decoder for mapping N−1 outputs of the N−1 comparators to bit-data streams and timing the output of the transition signal with the bit-data streams, wherein the number of bit-data stream is based on the number of voltage levels in the input modulated data stream.

3. The interface circuit of claim 2, wherein N equals to four, thereby the interface circuit enables clock and data recovery of 4-PAM modulated data streams using the 2-PAM CDR circuit.

4. The interface circuit of claim 1, wherein the threshold levels are set according to voltage levels of signals transmitter by a transmitter.

5. The interface circuit of claim 1, wherein the threshold levels are calibrated during power up of the interface circuit.

6. The interface circuit of claim 3, wherein the input data stream is compared to three configurable thresholds.

7. The interface circuit of claim 6, wherein a first configurable threshold is set to a common-mode voltage level plus a reference value representing an upper least significant bit (LSB) threshold value, a second configurable threshold is set to a common-mode voltage level representing a most significant bit (MSB) threshold value, and a third configurable threshold is set to a common-mode voltage level minus a reference value representing a lower LSB threshold value.

8. The interface circuit of claim 7, wherein the number of N−1 of edge detectors includes three edge detectors, wherein a first edge detector detects crossing of the upper LSB threshold, a second edge detector detects crossing of the MSB threshold, and a third edge detector detects crossing of the lower LSB threshold.

9. The interface circuit of claim 8, wherein the determination unit asserts the transition signal when only one of the edge detectors detects crossing or when all of the edge detectors detect crossing.

10. The interface circuit of claim 7, wherein the decoder maps outputs of the first comparator, the second comparator, and the third comparator to two separate bit-data streams respective of the input data stream, thus providing recovered bit-data streams.

11. The interface circuit of claim 10, wherein the decoder is adapted to output a logic value '00' when all comparators result in crossing of their respective thresholds, output a logic value '01' when the second and third comparators result in crossing of their respective thresholds; output a logic value '10' when the third comparator results in crossing of its respective threshold; and output a logic value '11' when none of the comparators result in crossing of their respective thresholds.

12. The interface circuit of claim 1, is further capable of processing 2-PAM modulated input data streams.

13. A receiver connected to a serial multimedia interface for processing high-speed multimedia signals transmitted by a transmitter over the serial multimedia interface, comprising:
  an adaptive equalizer for receiving an input data stream over the serial multimedia interface and generating an equalized input data stream, wherein the input data stream is a N-level pulse amplitude modulation (N-PAM) modulated data stream;
  an interface circuit connected to the adaptive equalizer for generating a transition signal indicating only major and minor transitions in the equalized input data stream and generating bit-data streams from the equalized input data stream, wherein N is a discrete number greater than two and the number of bit-data streams is based on the number of voltage levels in the input modulated data stream;
  a 2-PAM clock and data recover (CDR) circuit for locking on a signal used in transmission of the input data stream by phase aligning to the transitions in the input data stream based, in part, on the transition signal; and
  a data sampler for sampling the bit-data stream and generating serial bit streams, each of the serial bit streams includes k bits, wherein a major transition is a logic value change in a most significant bit (MSB) and a least significant bit (LSB) remains at a low-logic value, and a minor transition is a logic value change in a LSB or a logic value change in the MSB and the LSB remains at a high-logic value, wherein the MSB and LSB are two bits out of 2 bits in the input data stream.

14. The receiver of claim 13, wherein the interface circuit comprises: a number of N−1 comparators for comparing the equalized input data stream to N−1 configurable thresholds, wherein the N−1 configurable thresholds are N−1 different voltage levels; a number of N−1 of edge detectors respectively connected to the N−1 comparators for detecting transitions from one logic value to another logic value; and a determination unit for determining if the detected transitions include any one of a major transition and a minor transition and asserting a transition signal if only a major transition or a minor transition has occurred.

15. The receiver of claim 13, wherein the data sampler comprises: a number of flip-flops as the number of bit-data streams and each samples one of the bit-data streams using the clock signal provided by the 2-PAM CDR circuit; and a number of de-serializers as the number of flip-flops each respectively connected to the flip-flops and each de-serializer generates a single serial bit stream from a bit-data stream sampled by a flip-flop.

16. The receiver of claim 13, wherein the serial multimedia interface comprises at least one of: a high-definition multimedia interface (HDMI), a digital video interface (DVI), a DisplayPort (DP), and a universal serial bus (USB).

17. The receiver of claim 13, wherein N equals to four, thereby the receiver enables clock and data recovery of 4-PAM modulated data streams using the 2-PAM CDR circuit.

18. A method for enabling clock and data recovery (CDR) of N-level pulse amplitude modulation (N-PAM) modulated data streams using a 2-PAM CDR circuit comprising:
  comparing an input data stream to N−1 configurable thresholds, wherein the input data stream is N-PAM modulated and the N−1 configurable thresholds are N−1 different voltage levels;
  detecting transitions from one logic value to another logic value based on comparisons of the input data stream to the N−1 configurable thresholds, wherein N is a discrete number greater than two; and determining if the detected transitions include any one of a major transition and a minor transition; and
  asserting a transition signal if only a major transition or a minor transition has occurred, wherein the transition signal is fed into a 2-PAM CDR circuit and utilized for recovering a clock signal of the input data stream by phase aligning to the transitions in the input data stream based, in part, on the transition signal, wherein a major transition is a logic value change in a most significant bit (MSB) and a least significant bit (LSB) remains at a low-logic value, and a minor transition is a logic value change in a LSB or a logic value change in the MSB and the LSB remains at a high-logic value, wherein the MSB and LSB are two bits out of 2 bits in the input data stream.

19. The method of claim 18, further comprising: mapping N−1 outputs of the N−1 comparators to bit-data streams; and timing the outputs of the transition signal with the bit-data streams, the number of bit-data stream is based on the number of voltage levels in the input modulated data stream.

20. The method of claim 18, wherein N equals to four, thereby enabling clock and data recovery of 4-PAM modulated data streams using the 2-PAM CDR circuit.

21. The method of claim 20, wherein the input data stream is compared to three configurable thresholds, wherein a first configurable threshold is set to a common-mode voltage level plus a reference value representing an upper LSB threshold value, a second configurable threshold is set to a common-mode voltage level representing a MSB threshold value, and a third configurable threshold is set to a common-mode voltage level minus a reference value representing a lower LSB threshold value.

22. The method of claim 21, wherein detecting transitions from one logic value to another logic value further comprising: detecting crossing of the upper LSB threshold, the MSB threshold, and the lower LSB threshold.

23. The method of claim 22, wherein the transition signal is asserted when crossing of only one threshold is detected or crossing or crossing of all the threshold is detected.

* * * * *